United States Patent
Hirose et al.

(10) Patent No.: US 10,513,797 B2
(45) Date of Patent: Dec. 24, 2019

(54) MANUFACTURING METHOD OF EPITAXIAL SILICON WAFER

(71) Applicant: SUMCO CORPORATION, Tokyo (JP)

(72) Inventors: Takeshi Hirose, Tokyo (JP); Masayuki Tsuji, Tokyo (JP); Fumihiko Kimura, Nagasaki (JP)

(73) Assignee: SUMCO CORPORATION, Tokyo (JP)

(*) Notice: Subject to any disclaimer, the term of this patent is extended or adjusted under 35 U.S.C. 154(b) by 323 days.

(21) Appl. No.: 14/875,937

(22) Filed: Oct. 6, 2015

(65) Prior Publication Data

US 2016/0186360 A1 Jun. 30, 2016

(30) Foreign Application Priority Data

Dec. 25, 2014 (JP) .................. 2014-262930

(51) Int. Cl.
  *C30B 25/12* (2006.01)
  *H01L 21/02* (2006.01)
  *C30B 29/06* (2006.01)

(52) U.S. Cl.
  CPC ............ *C30B 25/12* (2013.01); *C30B 29/06* (2013.01); *H01L 21/02381* (2013.01); *H01L 21/02433* (2013.01); *H01L 21/02532* (2013.01)

(58) Field of Classification Search
  CPC ......... C30B 25/10; C30B 25/12; C30B 29/06; H01L 21/02381; H01L 21/02433; H01L 21/02532; H01L 21/02576; H01L 21/02579; H01L 21/0262
  See application file for complete search history.

(56) References Cited

U.S. PATENT DOCUMENTS 6,001,175 A    12/1999   Maruyama et al.
2009/0031954 A1  2/2009  Nishikido et al.

FOREIGN PATENT DOCUMENTS

| CN | 102751181 A | 10/2012 |
| JP | 08-239295 A | 9/1996 |
| JP | 2006049503 A * | 2/2006 |
| JP | 2007-243167 A | 9/2007 |
| JP | 2007-294942 | 11/2007 |
| JP | 2011-171637 A | 9/2011 |

(Continued)

OTHER PUBLICATIONS

Chinese Office Action from Application No. 201510982956.0 dated Feb. 2, 2018.

*Primary Examiner* — Hua Qi
(74) *Attorney, Agent, or Firm* — Greenblum & Bernstein, P.L.C.

(57) ABSTRACT

A manufacturing method of an epitaxial silicon wafer, using an epitaxial growth apparatus including a susceptor and a heat ring, includes: determining a surface position of a silicon wafer to be higher than a surface position of a peripheral portion of the susceptor and to be lower than a surface position of the heat ring; and adjusting a gap between the surface position of the silicon wafer and the surface position of the heat ring to control a difference between a film thickness of the epitaxial layer formed on a peripheral portion in a <110> orientation of the silicon wafer and a film thickness of the epitaxial layer formed on the peripheral portion in a <100> orientation of the silicon wafer.

2 Claims, 7 Drawing Sheets

(56) References Cited

FOREIGN PATENT DOCUMENTS

| | | | |
|---|---|---|---|
| JP | 2014-67955 | | 4/2014 |
| JP | 2014067955 A | * | 4/2014 |
| WO | 2007/091638 | | 8/2007 |

* cited by examiner

MANUFACTURING METHOD OF EPITAXIAL SILICON WAFER

The entire disclosure of Japanese Patent Application No. 2014-262930 filed Dec. 25, 2014 is expressly incorporated by reference herein.

TECHNICAL FIELD

The present invention relates to a manufacturing method of an epitaxial silicon wafer.

BACKGROUND ART

Recently, an epitaxial silicon wafer has been used for high-performance devices such as MPU and a flash memory and high-performance power devices such as MOS FET and IGBT. As high integration of the devices proceeds, an improvement in quality of a semiconductor substrate and, especially, highly accurate flattening for manufacturing a minute pattern is becoming important.

In epitaxial growth on a silicon wafer, which requires a highly accurate flatness, evenness of a film thickness has been improved by a single-wafer treatment. Moreover, the evenness of the film thickness has been enhanced by controlling gas flow for the epitaxial growth using a partition and the like.

However, since a growth rate of the epitaxial layer is different depending on a crystal orientation, a film thickness of the epitaxial layer formed on a peripheral portion of the silicon wafer varies, so that it is difficult to uniformize the film thickness of the epitaxial layer on the peripheral portion of the silicon wafer. As a method for overcoming this difficulty, a technique of vertically moving a susceptor in a direction perpendicular to a mounting surface of the susceptor on a periodic basis depending on a periodic change of the crystal orientation on the peripheral portion of a semiconductor wafer, the change caused by a horizontal rotation of the susceptor, is disclosed (Patent Literature 1: JP-A-2014-67955).

Moreover, a susceptor including: a wafer mounting portion on which a wafer is mounted; a peripheral portion that surrounds a circumferential edge of the wafer mounting portion; and a vapor-phase growth controller that is provided on the peripheral portion and controls a speed of vapor-growth on a peripheral portion of a wafer to be mounted is disclosed (Patent Literature 2: International Publication No. WO2007/091638, Patent Literature 3: JP-A-2007-294942).

However, in Patent Literature 1, for instance, as for a silicon wafer having a crystal orientation in a (100) orientation, it is necessary to vertically move the susceptor every time the silicon wafer is rotated by 45 degrees. Accordingly, in association with the vertical movement of the susceptor, it is likely that a flow of material gas becomes turbulent near the susceptor or the silicon wafer slightly vibrates. Consequently, the film thickness of the epitaxial layer formed over an entire surface of the silicon wafer may become uneven.

Moreover, in Patent Literatures 2 and 3, it is necessary to prepare a susceptor having a complicated shape corresponding to the crystal orientation of the peripheral portion of the wafer, which entails an increase in a processing cost of the susceptor.

SUMMARY OF THE INVENTION

An object of the invention is to provide a manufacturing method of an epitaxial silicon wafer, capable of easily uniformizing a film thickness of an epitaxial layer on a peripheral portion of a silicon wafer.

The reason why a growth rate of the epitaxial layer depends on a crystal orientation on a peripheral portion of a silicon wafer W when growing the epitaxial layer on a (100) plane of the silicon wafer will be described with reference to FIGS. 1 and 2.

As shown in FIG. 2, a <110> orientation of the silicon wafer W is defined as a standard crystal orientation W1. The <110> orientation in FIG. 2 corresponds to 0 degree (360 degrees), 90 degrees, 180 degrees and 270 degrees in FIG. 1. The <100> orientation in FIG. 2 corresponds to 45 degrees, 135 degrees, 225 degrees and 315 degrees in FIG. 1. FIG. 1 shows a profile in a film thickness of the epitaxial layer in a circumferential direction at a point closer to the center by 2 mm from the outer circumferential edge of the epitaxial silicon wafer.

As shown in FIG. 1, the film thickness of the epitaxial layer is thin on the peripheral portion in the <100> orientation, but the film thickness of the epitaxial layer is thick on the peripheral portion in the <110> orientation. Thus, the film thickness of the epitaxial layer on the peripheral portion in the circumferential direction varies on a periodic basis. It is inferred that this is because the growth rate of the epitaxial layer on the peripheral portion in the <100> orientation is high, whereas the growth rate of the epitaxial layer on the peripheral portion in the <110> orientation is low. It can be thus confirmed that the growth rate of the epitaxial layer on the peripheral portion depends on the crystal orientation of the silicon wafer as an underlayer.

It is inferred that this is because preferred orientation of a growth face is different in each of regions on the peripheral portion of the silicon wafer W since the outermost circumferential edge of the silicon wafer W is chamfered as shown in FIGS. 3A and 3B.

Specifically, as shown in FIG. 3B, a (110) plane in which the growth rate is high is present on the epitaxial layer formed on the chamfered edge in the <100> orientation. Since the epitaxial growth on this chamfered edge is promoted, the growth on the epitaxial layer on the peripheral portion is inhibited. On the other hand, as shown in FIG. 3A, a (311) plane and a (111) plane in which the growth rate is low are present on the epitaxial layer formed on the chamfered edge in the <110> orientation. Accordingly, since the epitaxial growth on these planes is inhibited, the growth on the epitaxial layer on the peripheral portion is promoted. Consequently, it is inferred that the film thickness of the epitaxial layer formed on the peripheral portion is thin in the <100> orientation and thick in the <110> orientation.

Thus, the film thickness of the epitaxial layer on the peripheral portion in the circumferential direction varies depending on the crystal orientation.

The inventors have found that a difference in the film thickness of the epitaxial layer on the peripheral portion of the silicon wafer generated during the epitaxial growth due to crystal orientation can be reduced by adjusting a relationship between a surface position of a component in a reaction chamber and a surface position of the silicon wafer in the epitaxial growth apparatus, thereby controlling a supply amount of material gas onto the peripheral portion of the silicon wafer. Thus, the inventors have achieved the invention.

According to an aspect of the invention, a manufacturing method of an epitaxial silicon wafer having an epitaxial layer on a surface in a (100) plane direction of a silicon wafer, the epitaxial layer being formed using an epitaxial growth apparatus including a susceptor on which a wafer is mounted and a heat ring that surrounds the susceptor with a space from an outer circumferential edge of the susceptor, includes: setting a surface position b of the silicon wafer to be higher than a surface position c of a peripheral portion of the susceptor and to be lower than a surface position a of the heat ring; and adjusting a gap (b−a) between the surface position b of the silicon wafer and the surface position a of the heat ring to control a difference between a film thickness of the epitaxial layer formed on a peripheral portion in a <110> orientation of the silicon wafer and a film thickness of the epitaxial layer formed on the peripheral portion in a <100> orientation of the silicon wafer.

In the above arrangement, the gap (b−a) between the surface position b of the silicon wafer and the surface position a of the heat ring is preferably in a range from −0.6 mm to −0.2 mm.

In the above arrangement, provided that an average of differences in a film thickness of the epitaxial layer formed on the peripheral portion in the <110> orientation of the silicon wafer is denoted by D1 and an average of differences in a film thickness of the epitaxial layer formed on the peripheral portion in the <100> orientation of the silicon wafer is denoted by D2, a ratio of D2 to D1 is preferably 70% or more.

Herein, the difference in the film thickness of the epitaxial layer is defined as a difference between a film thickness of the surface of the epitaxial layer in a region extending from the outer circumferential edge of the epitaxial silicon wafer to 2 mm closer to the center of the epitaxial silicon wafer and a reference film thickness that is a film thickness of the surface of the epitaxial layer in a region from 11 mm to 9 mm closer to the center of the epitaxial silicon wafer from the outer circumferential edge of the epitaxial silicon wafer.

According to the above aspect of the invention, the supply amount of the material gas onto the peripheral portion of the silicon wafer is controlled by adjusting the positional relationship among the surface position a of the heat ring, the surface position b of the silicon wafer, and the surface position c of a peripheral portion of the susceptor.

Specifically, the surface position b of the silicon wafer is adjusted to be higher than the surface position c of the peripheral portion of the susceptor (hereinafter referred to as condition (1)), the surface position b of the silicon wafer is adjusted to be lower than the surface position a of the heat ring (hereinafter referred to as condition (2)), and the difference (b−a) between the surface position b of the silicon wafer and the surface position a of the heat ring (hereinafter referred to as a gap value (b−a)) is adjusted. By adjusting the positional relationship as described above, the difference in the film thickness between the epitaxial layer formed on the peripheral portion of the silicon wafer in the <110> orientation and the epitaxial layer formed on the peripheral portion of the silicon wafer in the <100> orientation is controlled.

When the condition (1) is not satisfied, the material gas supplied in the reaction chamber is difficult to reach the peripheral portion of the silicon wafer, so that the film thickness of the entire epitaxial layer formed on the peripheral portion is decreased. Moreover, evenness of a film thickness distribution in the circumferential direction of the epitaxial layer on the peripheral portion is also deteriorated, so that a ratio of D2 to D1 tends to be decreased.

When the condition (2) is not satisfied, an amount of the material gas supplied in the reaction chamber and in contact with the peripheral portion of the silicon wafer is increased, so that the film thickness of the epitaxial layer formed on the peripheral portion is excessively increased.

As described above, by adjusting the gap value (b−a) that is a reference for the gas flow, the difference in the film thickness in the circumferential direction of the epitaxial layer formed on the peripheral portion of the silicon wafer generated during the epitaxial growth due to crystal orientation can be minimized.

Consequently, the epitaxial silicon wafer having a high flatness on the peripheral portion thereof can be obtained.

DESCRIPTION OF EMBODIMENT(S)

An exemplary embodiment of the invention will be described below with reference to the attached drawings.

Arrangement of Epitaxial Growth Apparatus

Firstly, an arrangement of an epitaxial growth apparatus will be described.

Figure 1:
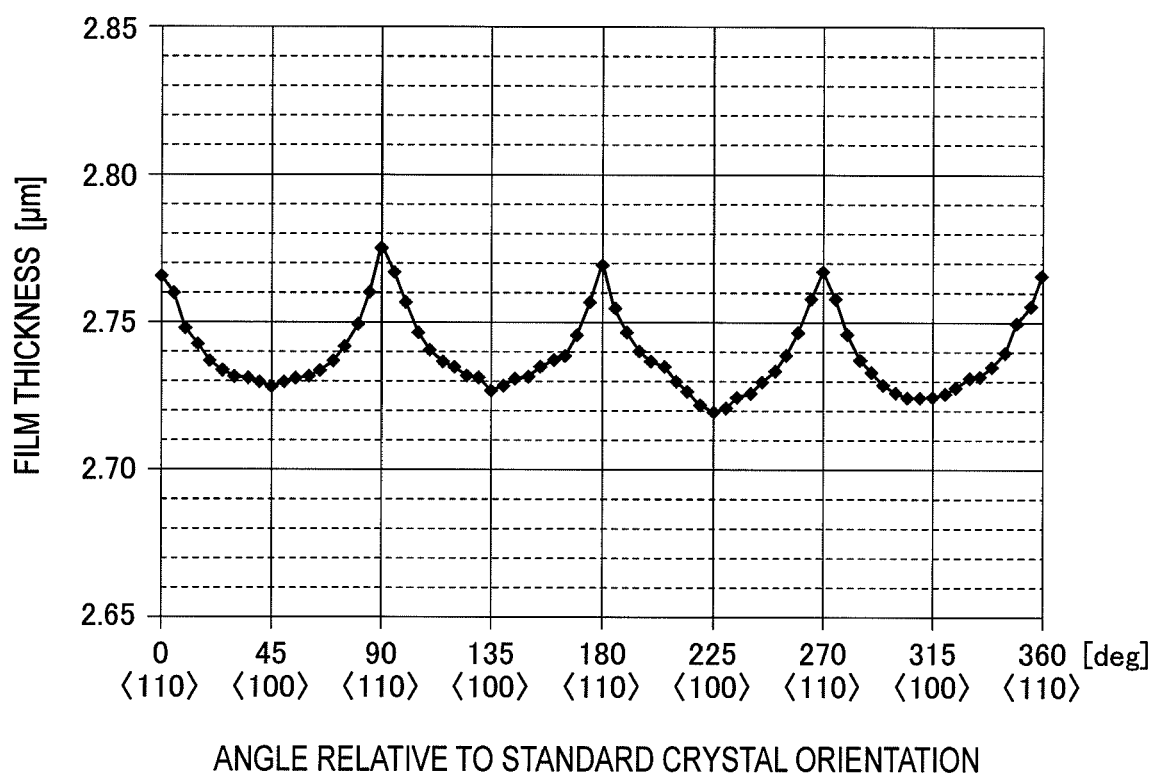
FIG. 1 is a chart showing a relationship between an angle from a reference crystal orientation and a film thickness of an epitaxial layer, on a peripheral portion of a silicon wafer.
Figure 2:
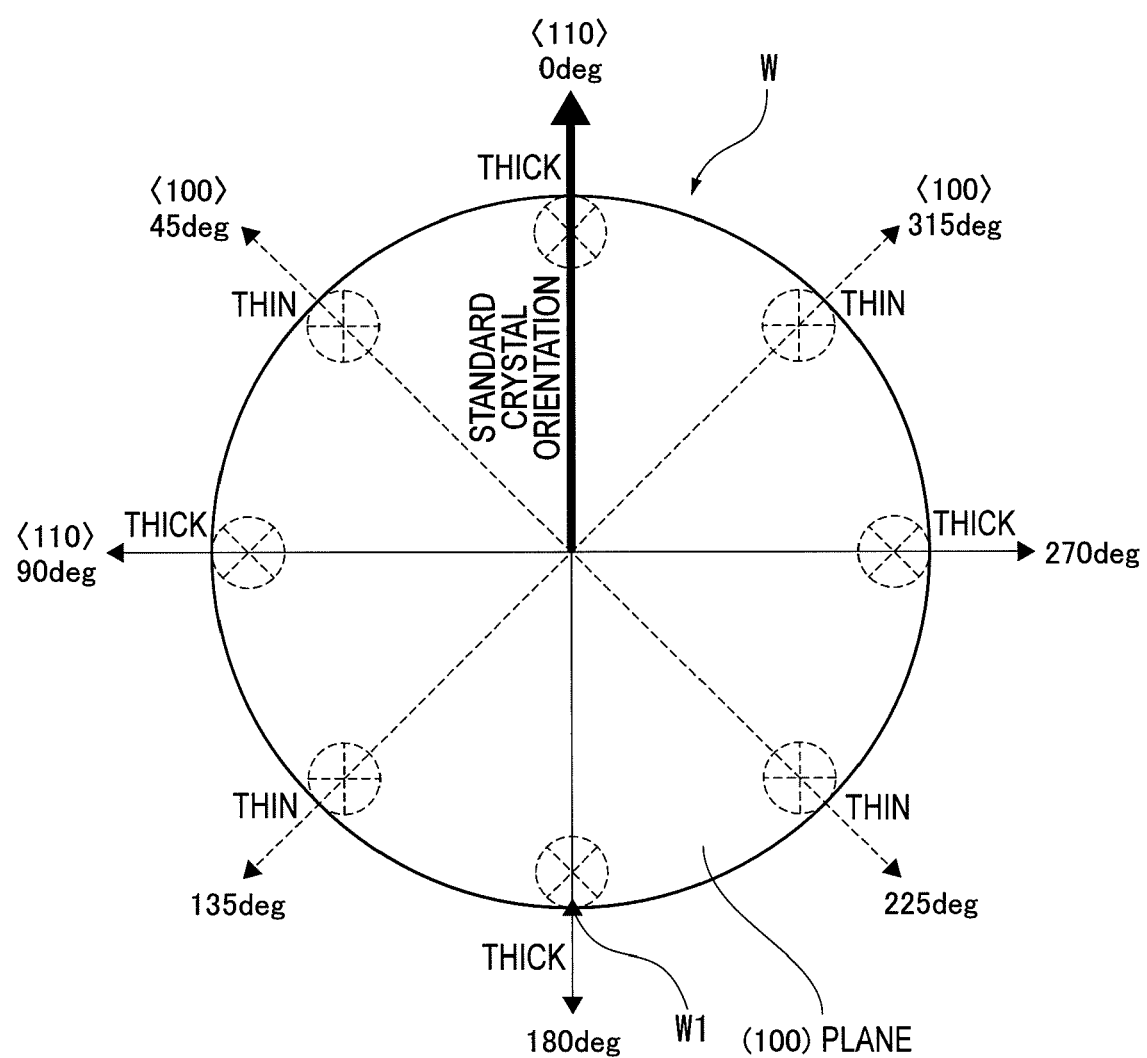
FIG. 2 is a top plan view showing a crystal orientation of a silicon wafer W.
Figure 3A:
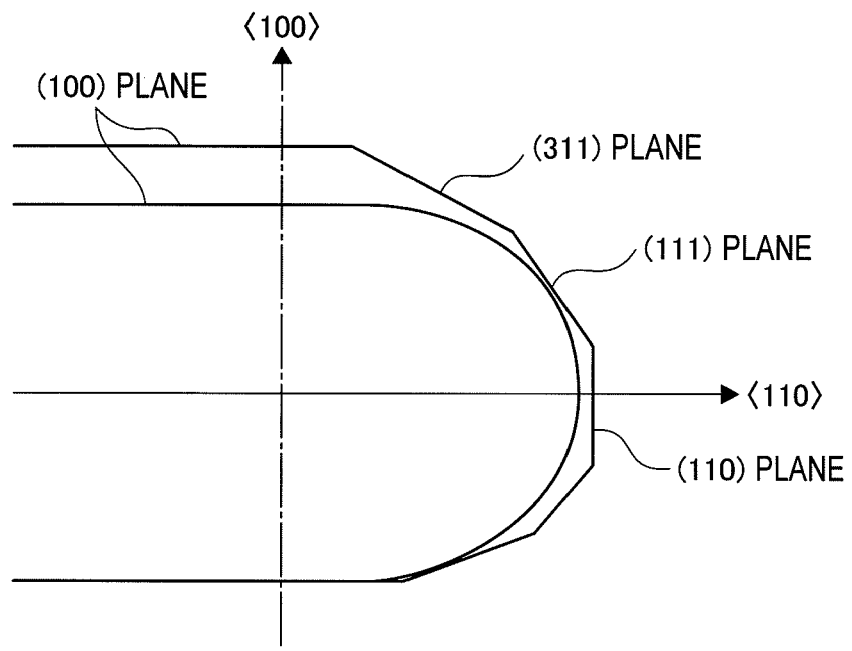
FIG. 3A is a partial cross section of an epitaxial silicon wafer at a peripheral portion thereof along <110> orientation.
Figure 3B:
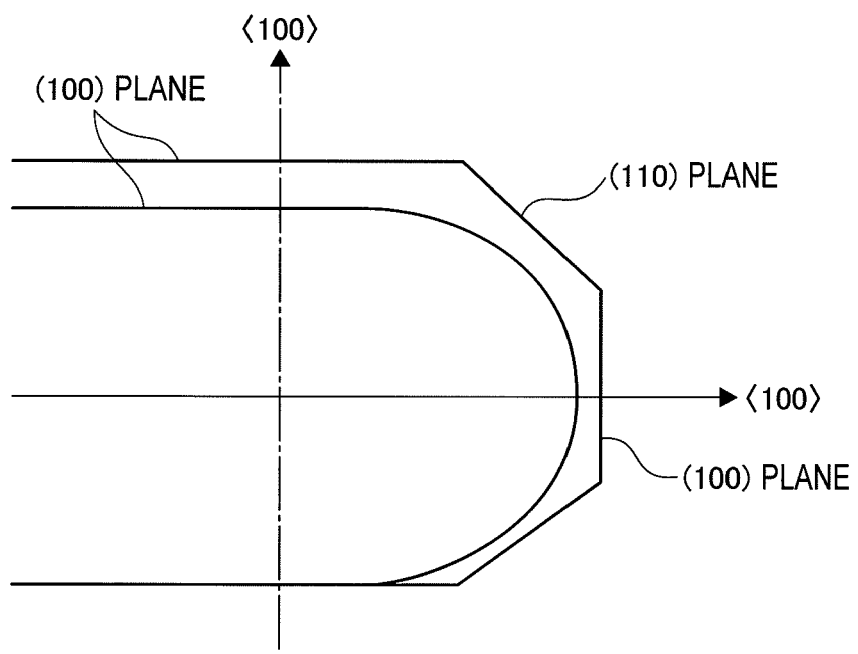
FIG. 3B is a partial cross section of the epitaxial silicon wafer at the peripheral portion thereof along <100> orientation.
Figure 4:
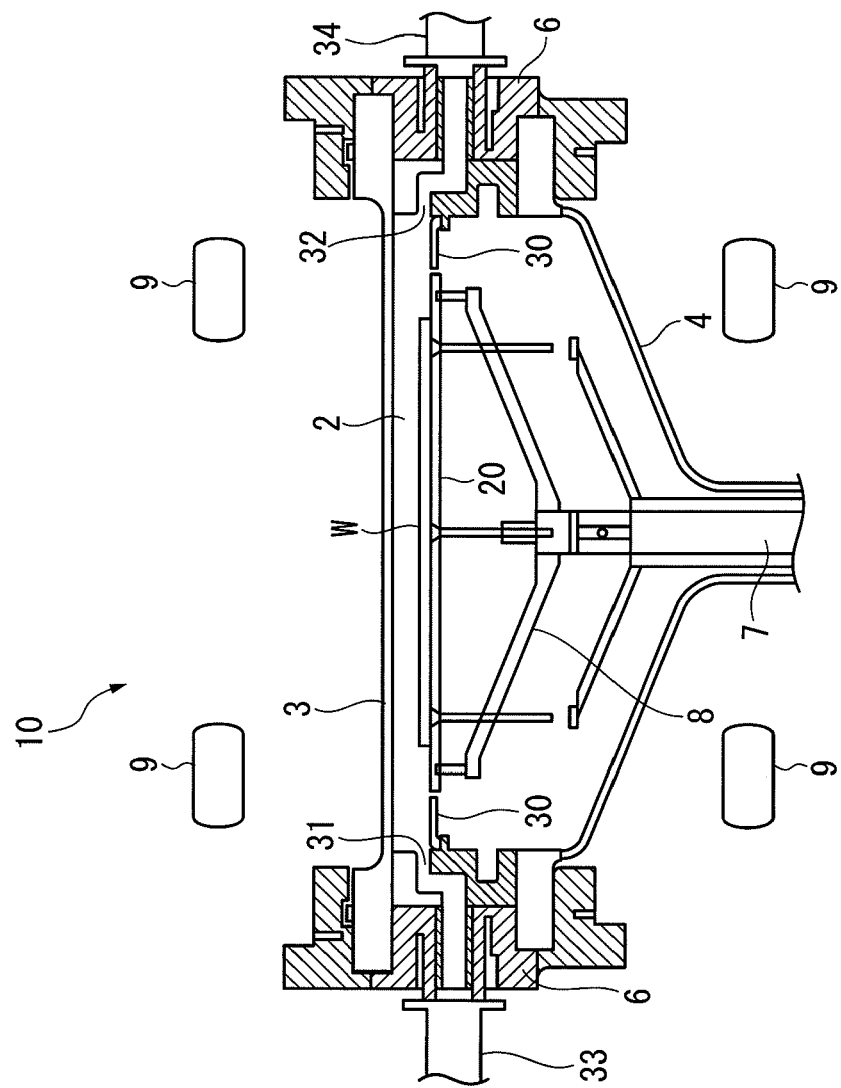
FIG. 4 schematically illustrates a single-wafer epitaxial growth apparatus.

As shown in FIG. 4, a single-wafer epitaxial growth apparatus 10 includes: a circular upper dome 3 having a concave surface; and a circular lower dome 4. The upper dome 3 and the lower dome 4 are formed of a transparent material such as quartz. The upper dome 3 and the lower dome 4 are vertically disposed to face each other. Peripheral ends of the upper dome 3 and the lower dome 4 are respectively fixed to upper and lower surfaces of an annular dome mount 6. With this arrangement, a sealed reaction chamber 2 substantially circular in a plan view is formed. Above and below the reaction chamber 2, a plurality of halogen lamps 9 for heating an inside of the reaction chamber 2 are spaced apart from each other at substantially equal intervals in a circumferential direction.

Figure 5:
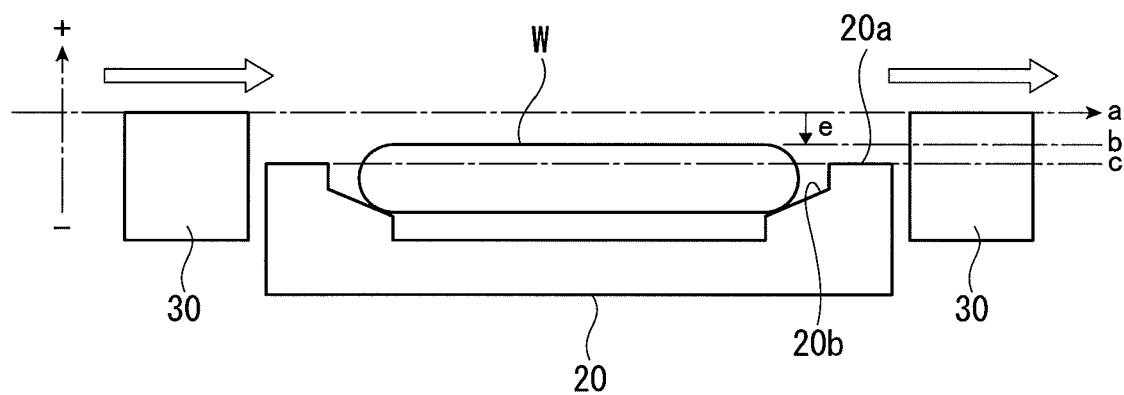
FIG. 5 illustrates a relationship between respective surface positions of a heat ring, a susceptor and the silicon wafer illustrated in FIG. 4.

In the reaction chamber 2, a susceptor 20 on which a silicon wafer W is mounted is disposed. The susceptor 20 is provided by coating an SiC film over a surface of a carbon material so that the susceptor can be resistant to high temperatures in the reaction chamber 2. The susceptor 20 is shaped in a disc having a predetermined film thickness and includes an upper surface 20a and a pocket 20b that is a circular concave and formed on the upper surface 20a. A radius of the pocket 20b is larger than that of the silicon wafer W to be mounted thereon. The silicon wafer W is horizontally mounted in the pocket 20b. As shown in FIG. 5, the susceptor 20 is formed such that a surface position b of the silicon wafer W is higher than a surface position c of a peripheral portion (i.e., the upper surface 20a) of the susceptor 20 when the silicon wafer W is mounted in the pocket 20b. Surrounding the susceptor 20, a heat ring 30 is provided concentric with the susceptor 20 with a space from an outer circumferential edge of the susceptor 20.

Referring back to FIG. 4, a susceptor support member 8 for supporting the susceptor 20 is provided on a rear (lower) surface of the susceptor 20. A shaft 7 is fixed to a bottom of the susceptor support member 8. The shaft 7 is rotatable by a rotation mechanism (not shown). Consequently, the susceptor support member 8 and the susceptor 20 are also rotatable at a predetermined speed in a horizontal plane. Moreover, the shaft 7 is vertically movable in an axial direction by a vertical movement mechanism (not shown). Consequently, the cylindrical susceptor support member 8 and the susceptor 20 are also vertically rotatable.

A gas supply port 31 through which gas flows into the reaction chamber 2 is provided at a predetermined position on the dome mount 6 of the reaction chamber 2. At an opposite position on the dome mount 6 (a position separated from the gas supply port 31 by 180 degrees), a gas discharge port 32 through which gas in the reaction chamber 2 is discharged is provided. Material gas is supplied from a gas supply pipe 33 to the reaction chamber 2 through the gas supply port 31, passes on a surface of the silicon wafer W in the reaction chamber 2 to reach the gas discharge port 32, and is discharged from the discharge pipe 34.

Manufacturing Method of Epitaxial Silicon Wafer

Next, a manufacturing method of the epitaxial silicon wafer in the exemplary embodiment using the single-wafer epitaxial growth apparatus 10 will be described.

In the manufacturing method of the epitaxial silicon wafer in the exemplary embodiment, a usable susceptor 20 has a shape satisfying a condition (1) when the silicon wafer W is mounted in the pocket 20b of the susceptor 20.

The silicon wafer W having a crystal plane on a (100) plane is mounted in the pocket 20b of the susceptor 20 by a transfer mechanism (not shown) in the reaction chamber 2. Subsequently, the reaction chamber 2 is sealed. Next, a positional relationship between the heat ring 30 and the silicon wafer W in the reaction chamber 2 is adjusted. The positional relationship is adjusted by vertically moving the shaft 7 of the susceptor support member 8 in the axial direction using the vertical movement mechanism (not shown).

As shown in FIG. 5, the positional relationship among the surface position a of the heat ring 30, the surface position b of the silicon wafer W, and the surface position c of the peripheral portion of the susceptor 20 is determined by adjusting the gap value (b−a) to control a difference between a film thickness of an epitaxial layer formed on a peripheral portion in a <110> orientation of the silicon wafer W and a film thickness of an epitaxial layer formed on a peripheral portion in a <100> orientation of the silicon wafer W while satisfying the conditions (1) and (2). Specifically, it is preferable to adjust the gap value (b−a) to a range from −0.6 mm to −0.2 mm.

Referring back to FIG. 4, the shaft 7 of the susceptor support member 8 is rotated at a predetermined speed by the rotation mechanism (not shown), thereby rotating the silicon wafer W mounted on the susceptor 20.

Next, a prebake step is conducted to remove natural oxide films or particles present on the surface of the silicon wafer W. The prebake step includes: supplying only hydrogen gas from a gas supply source (not shown) into the reaction chamber 2 through the gas supply port 31; heating the silicon wafer W by the halogen lamps 9 to about 1100 degrees C.; and keeping the heated silicon wafer W at about 1100 degrees C. for 70 seconds.

Next, a step for forming an epitaxial layer is conducted (an epitaxial layer forming step). Firstly, a reaction gas in which a carrier gas, material source gas, dopant gas and the like are mixed is supplied from the gas supply source (not shown) through the gas supply port 31 into the reaction chamber 2. Prior to the epitaxial layer forming step, since the positional relationship among the heat ring 30, the susceptor 20 and the silicon wafer W in the reaction chamber 2 is adjusted so that a difference between the growth rates depending on the crystal orientations becomes the minimum, a supply amount of the material gas onto the peripheral portion of the silicon wafer W is controlled.

Examples of the carrier gas include $H_2$ gas, $N_2$ gas and Ar gas. Examples of the material source gas include silicon tetrachloride ($SiCl_4$), monosilane ($SiH_4$), trichlorosilane (Si-$HCl_3$), and dichlorosilane. Examples of the dopant gas include diborane ($B_2H_6$) and phosphine ($PH_3$).

The halogen lamps 9 provided above and below the reaction chamber 2 radiate heat to keep the temperature of the silicon wafer W at about 1100 degrees C. With this arrangement, the material source gas and the like react on the surface of the silicon wafer W, so that the epitaxial layer can grow on the surface of the silicon wafer W.

By the above-described method, an epitaxial silicon wafer having a high flatness on a peripheral portion thereof can be manufactured.

Other Embodiments

The scope of the invention is not limited to the above-mentioned embodiment(s), but includes a variety of improvements and configuration modifications as far as an inventive concept of the invention is accomplished.

Further, the specific procedure and configurations may be altered in any manner as long as the modifications and improvements are compatible with the invention.

Example(s)

Examples of the invention will be described below, but by no means limit the scope of the invention.

Test No. 1 to No. 10

A p-type silicon wafer with a 300-mm diameter, a 775-μm thickness and a crystal plane on a (100) plane was prepared. A single-wafer epitaxial growth apparatus 10 shown in FIG. 4 was used. A susceptor 20 having a shallow pocket 20b was used. A difference (b−c) between the surface position b of the silicon wafer W and the surface position c of the peripheral portion of the susceptor 20 was +15 μm when the silicon wafer W was mounted in the pocket 20b of the susceptor 20.

Firstly, the silicon wafer W was mounted in the pocket 20b of the susceptor 20 and the reaction chamber 2 was sealed. Next, a positional relationship between the heat ring 30 and the silicon wafer W in the reaction chamber 2 was adjusted. Next, hydrogen gas was supplied into the reaction chamber 2 and hydrogen bake was conducted at the temperature of 1130 degrees C. for 30 seconds. After the hydrogen bake, in addition to hydrogen gas (carrier gas), silicon source gas (trichlorosilane) and dopant gas (diborane) were supplied in the reaction chamber 2 and epitaxial growth was conducted at the temperature of 1130 degrees C. By this treatment, an epitaxial silicon wafer in which an epitaxial layer having a 3-μm thickness on the center of the silicon wafer W was formed on the surface of the silicon wafer W was obtained.

A plurality of epitaxial silicon wafers were obtained by subjecting the silicon wafer W to epitaxial growth under the same conditions as described above except that the susceptor 20 and the silicon wafer W were vertically moved by the vertical movement mechanism (not shown) and the positional relationship between the heat ring 30 and the silicon wafer W was adjusted.

An average D1 of differences in a film thickness of the epitaxial layer formed on the peripheral portion in the <110> orientation and an average D2 of differences in a film thickness of the epitaxial layer formed on the peripheral portion in the <100> orientation of the epitaxial silicon wafers in Test No. 1 to No. 10 are shown in Table 1 below.

Herein, the difference in the film thickness of the epitaxial layer is specifically a difference between a film thickness of the surface of the epitaxial layer in a region extending from the outer circumferential edge of the epitaxial silicon wafer to 2 mm closer to the center of the epitaxial silicon wafer and a reference film thickness that is a film thickness of the surface of the epitaxial layer in a region from 11 mm to 9 mm closer to the center of the epitaxial silicon wafer from the outer circumferential edge of the epitaxial silicon wafer. The average in the <110> orientation means an average of differences in the film thickness of the surface of the epitaxial layer at 0 degree (360 degrees), 90 degrees, 180 degrees and 270 degrees. The average in the <110> orientation means an average of differences in the film thickness of the surface of the epitaxial layer at 45 degrees, 135 degrees, 225 degrees and 315 degrees. The film thickness of the epitaxial layer of the epitaxial silicon wafer was measured using a flatness measurement machine ("Wafer Sight" manufactured by KLA-Tencor Corporation).

Figure 6:
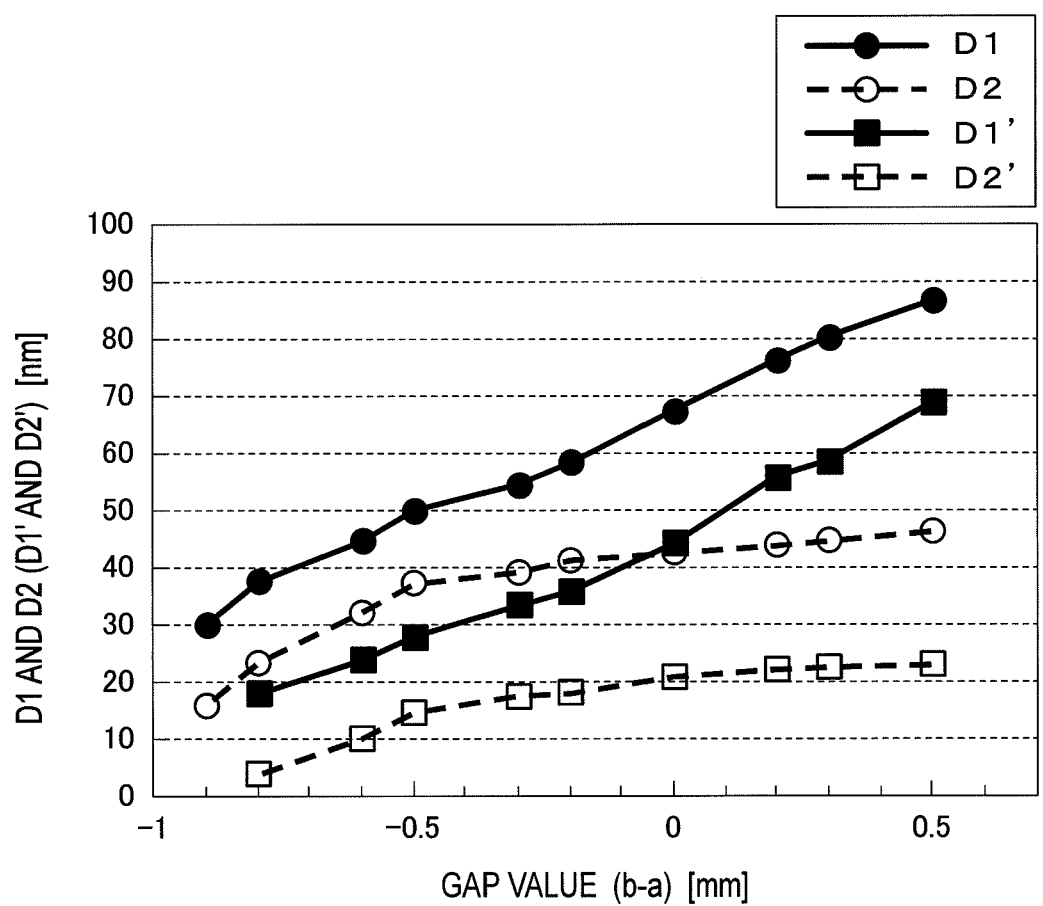
FIG. 6 is a chart showing a relationship between a gap value (b−a) and D1 and between the gap value (b−a) and D2.
Figure 7:
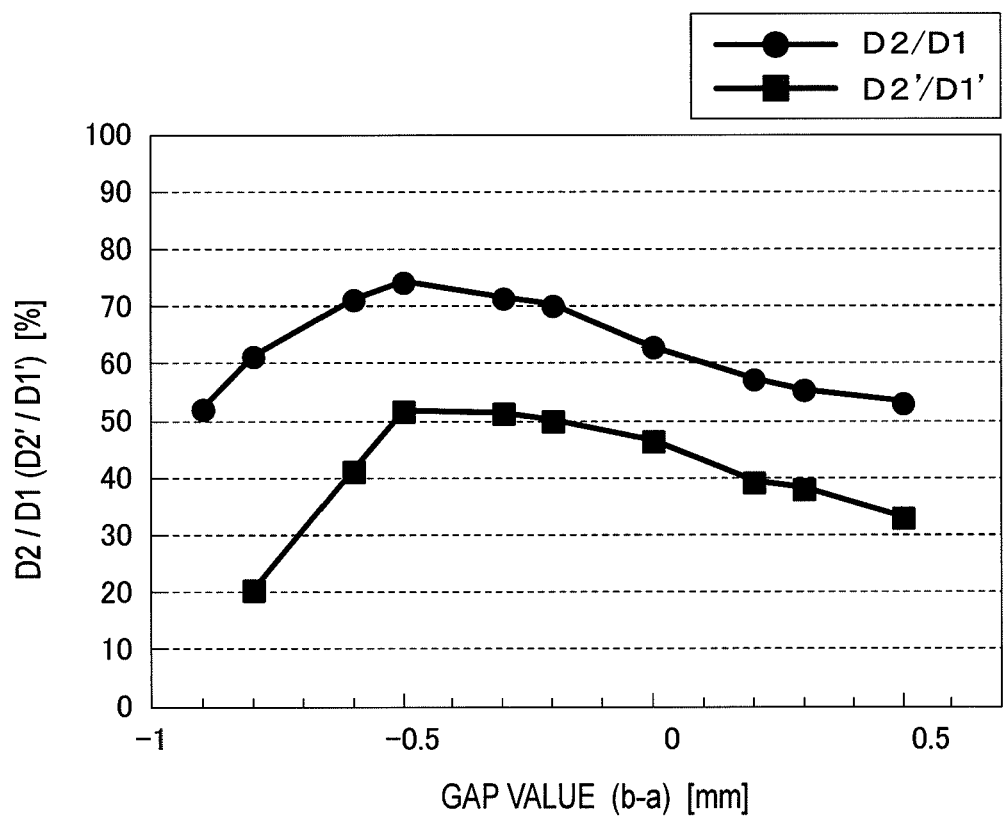
FIG. 7 is a chart showing a relationship between the gap value (b−a) and D2/D1.

FIG. 6 shows a relationship between a gap value (b–a) and D1 and between the gap value (b–a) and D2 in Table 1. FIG. 7 shows a relationship between the gap value (b–a) and D1 and D2/D1 in Table 1.

Test No. 11 to No. 20

A plurality of epitaxial silicon wafers were obtained by subjecting the silicon wafer W to epitaxial growth in the same manner as in Test No. 1 to No. 10 except that the pocket 20b of the susceptor 20 was changed to a deep pocket 20b so that the difference (b–c) between the surface position b of the silicon wafer W and the surface position c of the peripheral portion of the susceptor 20 was −30 μm. The results are shown in Table 1 below and FIGS. 6 and 7. It should be noted that the gap value (b–a), D1, D2 and D2/D1 in Test No. 11 to No. 20 were respectively denoted by the gap value (b–a)', D1', D2' and D2'/D1'.

TABLE 1

| No. | Gap value (b–c) [μm] | Gap value (b–a) [mm] | D1 *1) [nm] | D2 *2) [nm] | D2/D1 [%] | No. | Gap value (b–c) [μm] | Gap value (b–a)' [mm] | D1' *1) [nm] | D2' *2) [nm] | D2'/D1' [%] |
|---|---|---|---|---|---|---|---|---|---|---|---|
| 1 | 15 | 0.5 | 86.6 | 46.1 | 53.2 | 11 | −30 | 0.5 | 68.8 | 22.8 | 33.1 |
| 2 | 15 | 0.3 | 80.1 | 44.5 | 55.6 | 12 | −30 | 0.3 | 58.4 | 22.3 | 38.2 |
| 3 | 15 | 0.2 | 76.1 | 43.7 | 57.4 | 13 | −30 | 0.2 | 55.6 | 21.9 | 39.4 |
| 4 | 15 | 0 | 67.2 | 42.4 | 63.1 | 14 | −30 | 0 | 44.2 | 20.6 | 46.6 |
| 5 | 15 | −0.2 | 58.3 | 41.0 | 70.3 | 15 | −30 | −0.2 | 35.7 | 17.9 | 50.1 |
| 6 | 15 | −0.3 | 54.3 | 38.9 | 71.6 | 16 | −30 | −0.3 | 33.4 | 17.2 | 51.5 |
| 7 | 15 | −0.5 | 49.8 | 37.1 | 74.4 | 17 | −30 | −0.5 | 27.7 | 14.4 | 51.9 |
| 8 | 15 | −0.6 | 44.6 | 31.8 | 71.4 | 18 | −30 | −0.6 | 23.8 | 9.8 | 41.4 |
| 9 | 15 | −0.8 | 37.5 | 23.1 | 61.5 | 19 | −30 | −0.8 | 17.9 | 3.7 | 20.6 |
| 10 | 15 | −0.9 | 29.9 | 15.6 | 52.3 | 20 | −30 | −0.9 | — | — | — |

*1) the average of differences in a film thickness of the epitaxial layer formed on the peripheral portion in the <110> orientation
*2) the average of differences in a film thickness of the epitaxial layer formed on the peripheral portion in the <100> orientation According to Table 1 and FIG. 6, in Test No. 1 to No. 10, since both of D1 and D2 are increased as the gap value (b–a) is increased, it is understood that the growth rate of the epitaxial layer on the peripheral portion of the silicon wafer W tends to be increased.

According to Table 1 and FIG. 7, the results of D2/D1 show a slightly shifted distribution from the normal distribution. When the gap value (b–a) was near −0.5, D2/D1 was the maximum value. It is understood from the results that, when the epitaxial growth is performed at the setting of the gap value (b–a) being a negative value, the difference in the film thickness between the surface in the <110> orientation and the surface in the <100> orientation can be reduced, thereby more stably manufacturing an epitaxial silicon wafer. Among the results, it is particularly preferable that D2/D1 is 70% or more and the gap value (b–a) is in a range from 0.6 mm to −0.2 mm in which the difference in the film thickness in the circumferential direction of the epitaxial layer on the peripheral portion of the silicon wafer can be minimized.

In Test No. 11 to No. 20, the epitaxial growth was conducted using the susceptor 20 with a deep pocket 20b that did not satisfy the condition (1).

In comparison between Test No. 1 to No. 10 and Test No. 11 to No. 20, D1' and D2' in Test No. 11 to No. 20 tended to be small. Accordingly, the results demonstrated that the film thickness of the entire epitaxial layer formed on the peripheral portion was decreased when the condition (1) was not satisfied.

Moreover, the results showed that D2'/D1' was smaller than D2/D1 in Test No. 1 to No. 10 and evenness of the film thickness in the circumferential direction of the epitaxial layer on the peripheral portion was also deteriorated.

The invention claimed is:
1. A method for manufacturing an epitaxial silicon wafer comprising:
  forming an epitaxial layer on a surface in a (100) plane direction of a silicon wafer to obtain the epitaxial silicon wafer, the epitaxial layer being formed on the silicon wafer using an epitaxial growth apparatus comprising a susceptor on which the silicon wafer is mounted and a heat ring that surrounds the susceptor with a space therebetween such that an entire inner circumferential surface of the heat ring is positioned outside an outer circumferential surface of the susceptor, wherein:

a surface position b of the silicon wafer is set to be higher than a surface position c of a peripheral portion of the susceptor and to be lower than a surface position a of the heat ring; and a gap (b−a) is adjusted between the surface position b of the silicon wafer and the surface position a of the heat ring to a range from −0.6 mm to −0.2 mm and then the epitaxial layer is formed on the silicon wafer to control a difference between a film thickness of the epitaxial layer formed on a peripheral portion in a <110> orientation of the silicon wafer and a film thickness of the epitaxial layer formed on the peripheral portion in a <100> orientation of the silicon wafer.

2. The method for manufacturing the epitaxial silicon wafer according to claim 1, wherein provided that an average of differences in the film thickness of the epitaxial layer formed on the peripheral portion in the <110> orientation of the silicon wafer is denoted by D1 and an average of differences in the film thickness of the epitaxial layer formed on the peripheral portion in the <100> orientation of the silicon wafer is denoted by D2, a ratio of D2 to D1 is 70% or more.

* * * * *